(12) United States Patent
Chatoor et al.

(10) Patent No.: US 9,111,657 B2
(45) Date of Patent: Aug. 18, 2015

(54) CHARGED PARTICLE OPTICAL DEVICE

(71) Applicant: Mapper Lithography IP B.V., Delft (NL)

(72) Inventors: Sohail Chatoor, Delft (NL); Joost Witteveen, Delft (NL); Alon Rosenthal, Delft (NL); Johan Joost Koning, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/477,769

(22) Filed: Sep. 4, 2014

(65) Prior Publication Data
US 2015/0069259 A1    Mar. 12, 2015

Related U.S. Application Data

(60) Provisional application No. 61/874,394, filed on Sep. 6, 2013.

(30) Foreign Application Priority Data

Sep. 6, 2013   (NL) ...................................... 2011401

(51) Int. Cl.
| | | |
|---|---|---|
| *G21K 1/08* | (2006.01) | |
| *H01J 37/147* | (2006.01) | |
| *G21K 1/093* | (2006.01) | |
| *G21K 1/087* | (2006.01) | |
| *H01J 37/317* | (2006.01) | |
| *H01F 7/06* | (2006.01) | |

(52) U.S. Cl.
CPC ............... G21K 1/093 (2013.01); G21K 1/087 (2013.01); H01J 37/1475 (2013.01); H01J 37/3177 (2013.01); H01F 2007/068 (2013.01)

(58) Field of Classification Search
CPC ...... H01J 37/147; H01J 37/3177; G21K 1/08; H01F 2007/068
USPC ....................................... 250/396 R, 396 ML
See application file for complete search history.

(56) References Cited

U.S. PATENT DOCUMENTS

| | | | | |
|---|---|---|---|---|
| 6,153,885 A | * | 11/2000 | Kendall | ................. 250/396 ML |
| 2006/0060790 A1 | | 3/2006 | Nakasuji et al. | |
| 2011/0180722 A1 | * | 7/2011 | Hill | ............................... 250/397 |

FOREIGN PATENT DOCUMENTS

| | | |
|---|---|---|
| WO | WO 2010/125526 A1 | 11/2010 |
| WO | WO 2013/037486 A2 | 3/2013 |

OTHER PUBLICATIONS

Jones, G W et al. "Microstructures for Particle Beam Control" Journal of Vacuum Science and Technology: Part B, AVS/AIP, Melville, New York, NY, US Nov. 1, 1988.

*Primary Examiner* — Robert Kim
*Assistant Examiner* — Eliza Osenbaugh-Stewar
(74) *Attorney, Agent, or Firm* — Blakely Sokoloff Taylor & Zafman

(57) ABSTRACT

The invention relates to a charged particle optical device for manipulating a trajectory of multiple beamlets of charged particles. Said charged particle optical device comprising an electromagnetic deflector comprising a planar substrate having an upper side and a lower side of said substrate, and an even thickness. The substrate comprises:
a through opening for passing said beamlets there through, wherein said through opening debouches in the upper and lower side of said substrate;
a first and a second coil, wherein each of said coils preferably is a substantially helical coil and comprises conducting upper leads arranged at the upper side, conducting lower leads arranged at the lower side, and vias extending through said substrate and which conductively connect one of said upper leads with one of said lower leads for forming said coil;
wherein said first and second coils are arranged on either side of the through opening.

29 Claims, 9 Drawing Sheets

CHARGED PARTICLE OPTICAL DEVICE

BACKGROUND OF THE INVENTION

1. Field of the Invention

The present invention relates to a charged particle optical device for manipulating a trajectory of one or more beamlets of charged particles, in particular for use in a charged particle multi-beamlet exposure system for exposing a target using a plurality of charged particle beamlets. In addition the present invention relates to a charged particle optical device comprising such a device. In addition, the present invention relates to a method for manipulating a trajectory of one or more beamlets of charged particles in a charged particle multi-beamlet exposure system.

2. Description of the Related Art

WO 2010/125526 describes a charged particle optical device. This charged particle optical device comprises a substantially flat substrate comprising an aperture for passing said plurality of beamlets there through. The flat substrate supports the electrodes of an electrostatic deflector for deflecting said plurality of beamlets of charged particles, which electrodes at least partially and suitably largely overlies the aperture in the substrate. Said electrostatic deflector comprises a first and a second straight and elongated electrode which are arranged along the longitudinal sides of an elongated passing window, and which electrostatic deflector deflect the plurality of beamlets which pass through said window by operation of an electric field between said first and second electrodes.

As described in WO 2010/125526, the electrostatic deflection comprises a plurality of windows which are arranged in parallel. Each of said windows is relatively long to obtain maximum uniformity. In addition, each of said windows preferably has a relatively small width in order that the potential difference over the electrodes may be reduced considerably, while still obtaining a sufficient deflection angle. The advantages of such a design are described in detail in WO 2010/125526.

In the known electrostatic deflector, said elongated passing window can be arranged for passing a large number of tightly packed beamlets there through and said large number of beamlets can be deflected simultaneously.

A disadvantage of the known electrostatic deflector is that the large number of simultaneously deflected beamlets can only be deflected in a direction substantially perpendicular to said electrodes. Said beamlets can thus only be deflected in a direction substantially perpendicular to the longitudinal direction of the elongated window(s).

It is an object of the present invention to provide a charged particle optical device which can simultaneously deflect the large number beamlets in a direction substantially parallel to the longitudinal direction of said elongated window(s).

SUMMARY OF THE INVENTION

According to a first aspect, the present invention provides a charged particle optical device for manipulating a trajectory of one or more beamlets of charged particles, said charged particle optical device comprises a first electromagnetic deflector comprising a substantially planar substrate having a first surface at or near an upper side of said substantially planar substrate, a second surface at or near a lower side of said substantially planar substrate, and a substantial even thickness, wherein the substrate comprises:

a through opening for passing said one or more beamlets there through, wherein said through opening debouches in the upper side and lower side of said substantially planar substrate;

a first and a second coil, wherein each of said first and second coil comprises one or more conducting upper leads arranged on the first surface, one or more conducting lower leads arranged on the second surface, and one or more vias which extend through said substrate wherein each of said vias is arranged for conductively connecting one of said upper leads with one of said lower leads for forming said coil;

wherein said first and second coils are arranged on either side of the through opening.

When an electrical current is directed through said first and second coil, in particular in the same direction through said first and second coil, a magnetic field is established. This magnetic field has field lines which extend through the first coil, pass over said through opening and extend through said second coil. The one or more beamlets which pass through said through opening are deflected by the magnetic field is a direction perpendicular to the field lines, thus in a direction substantially parallel to said upper and lower leads of the helical coils.

In comparison it is noted that in the electrostatic deflector of the prior art the one or more beamlets which pass through said through opening are deflected by the electric field in a direction substantially transverse to said first and second electrodes. The first and second electrodes are arranged along the longitudinal sides of an elongated passing window A further advantage of the electromagnetic deflector of the invention is, that the electromagnetic deflector is arranged on a substantially flat substrate, just as the electrostatic deflector of the prior art. The build-in space required for the electromagnetic deflector of the invention, at least in a direction parallel to the trajectory of the charged particle beamlets is small, in particular less than 10 mm, preferably less than 5 mm, more preferably less than 3 mm.

In an embodiment, said first and/or said second coil comprises a substantially helical coil. The one or more conducting upper leads arranged on the first surface, one or more conducting lower leads arranged on the second surface, and one or more vias which extend through said substrate, constitute the windings of the respective coil.

The helix of the coils can twist in two possible directions, which is known as handedness. Preferably the first and second coil have the same handedness.

In an embodiment, the first and second coil have substantially the same lead. The lead is the distance along the coil's central axis that is covered by one complete rotation of a winding)(360°).

In an embodiment, the though opening defines a substantially rectangular window having two longitudinal sides and two transverse sides, wherein the first and second coils are arranged adjacent said longitudinal sides.

In an embodiment, the charged particle optical device further comprises a flux confinement member which is arranged around the coils at a side facing away from the through opening(s). In an embodiment, the flux confinement member is arranged to surround the substantially planar substrate. Such a flux confinement member substantially confines the magnetic field in the plane of the planar substrate for providing the desired deflection at or in the through opening of the substrate. Without the flux confinement member, there are returning field lines above and below the substrate which would cause a deflection of the one or more beamlets opposite the desired deflection direction.

In an embodiment, the flux confinement member comprises a magnetizeable material, preferably ferrite.

In an embodiment, the through opening is a first through opening for passing a first set of one or more beamlets there through, and wherein the substrate comprises:

a second through opening for passing a second set of one or more beamlets there through, wherein said second through opening debouches in the upper side and lower side of said substantially planar substrate, and wherein said second through opening is arranged at a side of said second coil facing away from said first through opening, and a third coil, wherein said third coil comprises one or more conducting upper leads arranged on the first surface, one or more conducting lower leads arranged on the second surface, and one or more vias which extend through said substrate wherein each of said vias is arranged for conductively connecting one of said upper leads with one of said lower leads for forming said coil;

wherein said third coil is arranged on a side of the second through opening facing away from said second coil.

This embodiment, with at least two through openings is suitable for use in a multi-beamlet exposure system having a very large number of beamlets, for example 10,000 or more. The large number of beamlets are now divided in two or more sets of beamlets, each set traversing a corresponding one of the through openings, each of said through openings having a limited size, at least in a direction between the coils, in order to obtain a substantial homogeneous magnet field in said through opening.

In an embodiment, said third coil comprises a substantially helical coil. The one or more conducting upper leads arranged on the first surface, one or more conducting lower leads arranged on the second surface, and one or more vias which extend through said substrate, constitute the windings of the respective coil. Preferably the third coil has the same handedness as the first and second coils. Preferably the third coil has substantially the same lead as the first and second coils.

In an embodiment, the substantially flat substrate is provided with one or more further through openings which are arranged between the first and second through opening, wherein the first, second and further through openings are arranged at a distance from each other, and wherein at an area between two of said through openings a coil is arranged. The two or more through openings are divided over the surface of the substantially flat substrate.

In case the through openings are elongated rectangular windows, the two or more through openings are preferably arranged adjacent to each other in a direction perpendicular to the longitudinal direction of the elongated windows.

In an embodiment, the flux confinement member is arranged adjacent the two outermost coils, in particular the first and third coil when these are the two outermost coils. By arranging the flux confinement member adjacent said outermost coils, the returning magnetic fields is effectively confined within said flux confinement member and the effect of magnetic stray fields is at least reduced, and preferably substantially nullified.

In an embodiment, the number of coil turns of the second coil is equal to the number of coil turns of the first coil plus the number of coil turns of the third coil. When the flux confinement member is arranged directly adjacent the first and the third coil, substantially the full magnetic flux generated by the first coil is confined by the confinement member and directed to the third coil, and vice versa. Thus the flux of the first coil is supplemented by the flux of the third coil, and vice versa. The flux at the first coil is substantially equal to the flux generated by a virtual coil having a number of coil turns which is equal to the number of coil turns of the first coil plus the number of coil turns of the third coil. Providing the second coil with the same number of coil turns as the virtual coil, when using substantially the same current for driving said coils, yields a substantially homogeneous magnetic field over all through openings of the magnetic deflector.

In an embodiment, the at least the first and second surfaces of the substantially planar substrate, with the exception of the through opening(s), are substantially covered with a first layer of electrical insulating material and a second layer of electrical conducting material, wherein the first layer is sandwiched between the second layer and the substantially planar substrate. The second layer of electrical conducting material can provide a better thermal conduction to a heat sink, which will reduce the thermal load of the deflector. In addition the second layer can be connected to ground potential for the removal of charge which, in use, may accumulate on the first and second surfaces. The first layer is arranged to protect the leads of the coils and the vias and to electrically isolate the leads and vias from the first layer.

In an embodiment, the through opening(s) comprises an inner circumferential edge, wherein said inner circumferential edge is substantially covered with a layer of electrical conducting material. In an embodiment, the planar substrate comprises an outer circumferential edge, wherein said outer circumferential edge is substantially covered with a layer of electrical conducting material. This provides a better electrical and/or thermal connection between the electrical conducting layers on the first and second surfaces of the substantially planar substrate.

In an embodiment, the second layer comprises a layer of Molybdenum, which layer of Molybdenum is arranged at a side of the second layer facing away from the substantially planar substrate. Thus the Molybdenum is arranged at the outermost surface of the substrate. An advantage of using a Molybdenum outer layer is that even when this outer layer oxidizes, the resulting oxides are still electrically conducting.

In an embodiment, the charged particle optical device comprises a second electromagnetic deflector which substantially is a duplicate of the first electromagnetic deflector, and is arranged at a distance from said first electromagnetic deflector, in particular in a direction along the trajectory, wherein one of the one or more the through openings of the second electromagnetic deflector is in line with one of the one or more the through openings of the first electromagnetic deflector.

In an embodiment, the second electromagnetic deflector is arranged with respect to the first electromagnetic deflector such that at least the first and second coils of the second electromagnetic deflector extend substantially parallel to the first and second coils of the first electromagnetic deflector.

In an embodiment, the second electromagnetic deflector is arranged and/or controlled for deflecting the one or more beamlets in a direction substantially opposite to a deflection of the first electromagnetic deflector.

In an embodiment, the charged particle optical device with at least the first electromagnetic deflector further comprises a first electrostatic deflector comprising a second substantially planar substrate having a substantially even thickness, wherein the second substrate comprises one or more through openings for passing said one or more beamlets there through, wherein said one or more through openings debouche in an upper side and a lower side of said second substrate, wherein at each through opening said second substrate comprises a first and a second electrode which are arranged on either side of the through opening for providing an electric field in said through opening, wherein the first electrostatic deflector is arranged at a distance from said first electromagnetic deflector, in particular in a direction along the trajectory, wherein at least one of the one or more through openings of the first electrostatic deflector is in line with one of the one or more through openings of the first electromagnetic deflector.

Thus the electromagnetic deflector of the invention can be arranged adjacent, or even abutting an electrostatic deflector, wherein the deflection provided by the electromagnetic deflector is substantially orthogonal to the deflection provided by the electrostatic deflector, which enables to direct the one or more beamlets at any direction within the substantially orthogonal deflection ranges of the electromagnetic and electrostatic deflector.

In an embodiment, the first electrostatic deflector is arranged with respect to the first electromagnetic deflector such that at least the first and second electrode of the first electrostatic deflector extend substantially parallel to the first and second coils of the first electromagnetic deflector.

In an embodiment, the charged particle optical device comprising the first electrostatic deflector, also comprises a second electrostatic deflector which substantially is a duplicate of the first electrostatic deflector, and is arranged at a distance from said first electrostatic deflector, in particular in a direction along the trajectory, wherein at least one of the one or more through openings of the second electrostatic deflector is in line with one of the one or more through openings of the first electrostatic deflector.

In an embodiment, the second electrostatic deflector is arranged with respect to the first electrostatic deflector such that at least the first and second electrodes of the second electrostatic deflector extend substantially parallel to the first and second electrodes of the first electrostatic deflector.

In an embodiment, the second electrostatic deflector is arranged and/or controlled for deflecting the one or more beamlets is a direction substantially opposite to a deflection of the first electrostatic deflector.

In an embodiment, the charged particle optical device comprises a cooling arrangement or is mounted onto a cooling arrangement. The cooling arrangement acts as a heat sink, and will reduce, in use, the thermal load of the deflector.

In an embodiment, the cooling arrangement comprises a third substantially planar substrate having a substantial even thickness, wherein the third substrate comprises one or more through openings for passing said one or more beamlets there through, wherein said one or more through openings debouch in an upper side and a lower side of said third substrate, wherein said third substrate is provided with flow channels for a cooling fluid which flow channels are arranged adjacent said through openings, wherein at least one of the one or more the through openings of the cooling arrangement is in line with one of the one or more through openings of the first electromagnetic deflector. Such a planar cooling arrangement is readily combinable with the planar electromagnetic deflector(s) of the present invention, and also with the electrostatic deflector(s). A number of such electromagnetic deflector(s) and electrostatic deflector(s) can be stacked onto said planar cooling arrangement.

According to a second aspect, the present invention provides a charged particle multi-beamlet exposure system for exposing a target using a plurality of charged particle beamlets, wherein the system comprises:

a beamlet generator for generating the plurality of charged particle beamlets;

a beamlet projector for projecting one or more of said plurality of charged particle beamlets onto a surface of said target, wherein the beamlet projector comprises a charged particle optical device as described above or according to any one of the previously described embodiments.

In an embodiment, said system further comprises a beamlet modulator for patterning the beamlets to form modulated beamlets, and wherein said beamlet projector is arranged for projecting the modulated beamlets onto said surface of the target.

In an embodiment, said system is a lithography system or a microscopy system.

According to a third aspect, the present invention provides a method for manipulating a trajectory of one or more beamlets of charged particles in a charged particle multi-beamlet exposure system as described above, wherein said method comprises the step of:

directing an electrical current through said first and second coil in order to provide a magnetic field inside said through opening which deflect the one or more beamlets which pass through said through opening in a direction substantially transverse to said magnetic field.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of exemplary embodiments shown in the attached drawings, in which.

DETAILED DESCRIPTION OF THE INVENTION

Figure 1:
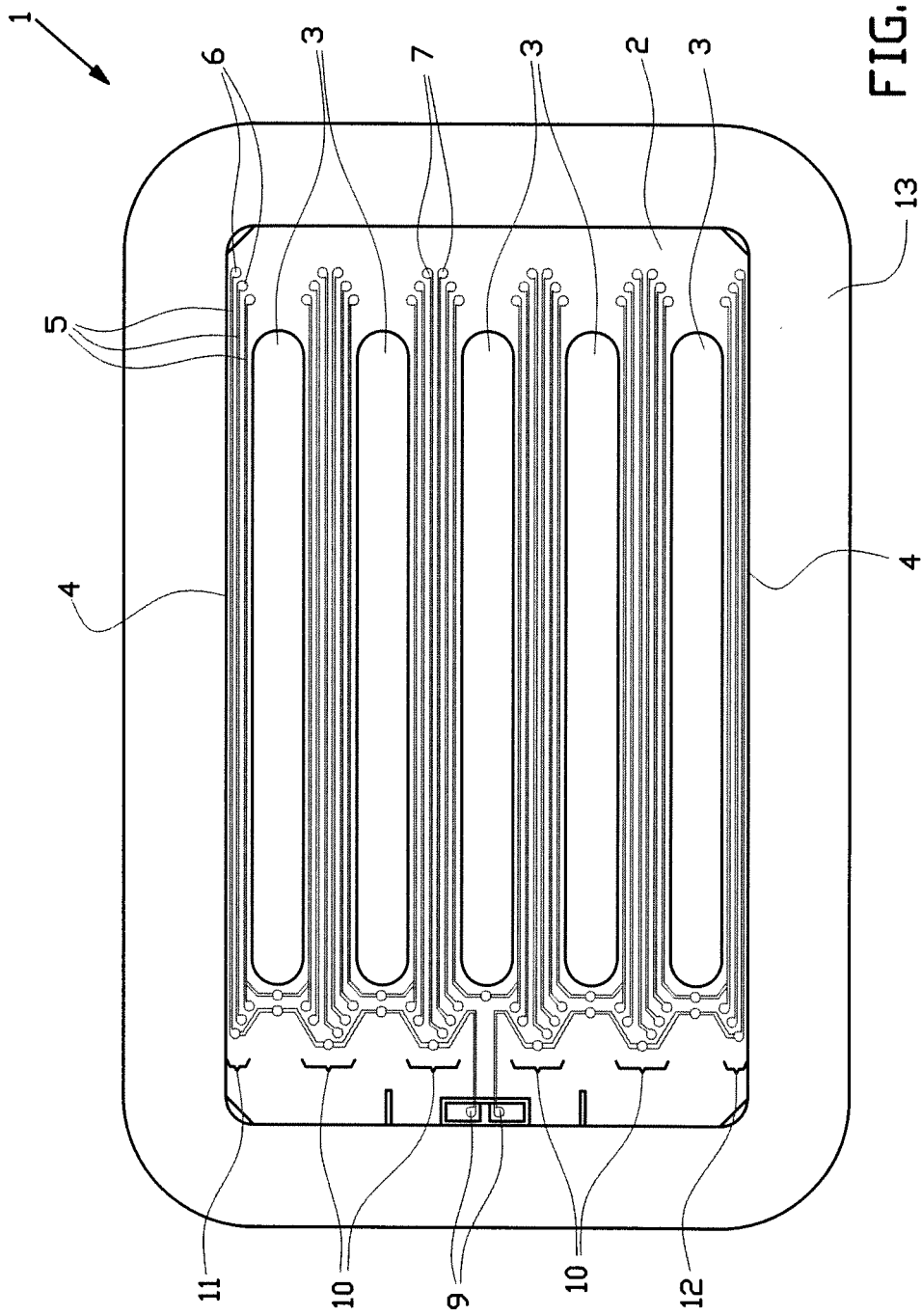
FIG. 1 shows a schematic view of a first example of a charged particle optical device with an electromagnetic deflector of the invention.

In the figures, identical reference numerals relate to identical or at least comparable technical features. The figures are not drawn to scale and are intended for illustrative purpose only. The figures show examples which are not intended to limit the claims anyhow.

Figure 2:
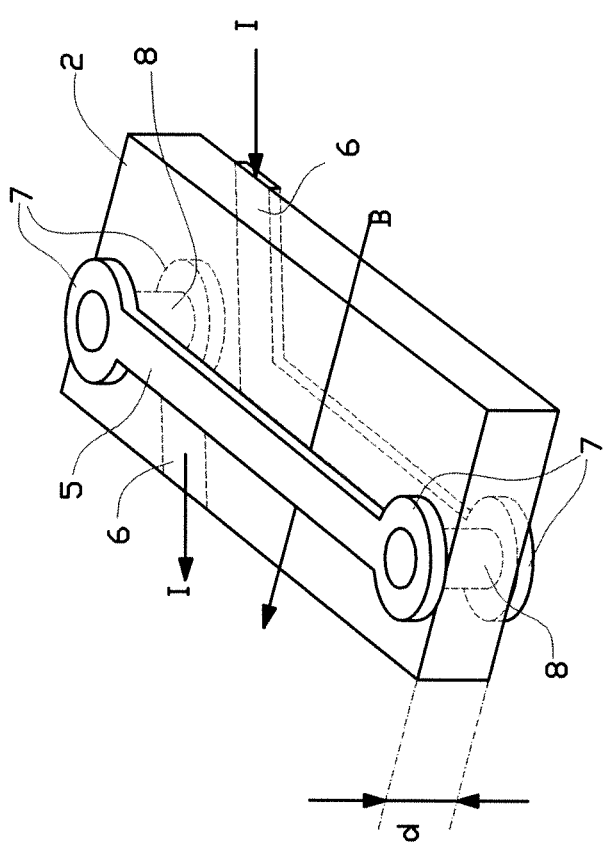
FIG. 2 shows schematically the leads on the first and second side of the substrate of the example of FIG. 1 and the vias connecting said leads, FIG. 3 schematically shows the magnetic field generated in the electromagnetic deflector of FIG. 1.

FIG. 1 shows a top view of a first example of a charged particle optical device with an electromagnetic deflector 1 of the invention. The electromagnetic deflector comprises a substantially rectangular Printed Circuit Board (PCB) 2 which acts as a substantially planar substrate for the coils of the electromagnetic deflector 1. The PCB 2 is provided with five through openings 3 for passing a multitude of charged particle beamlets there through. On the areas between the individual through openings 3 and between the through openings 3 and the longitudinal edges 4 of the PCB, copper upper leads 5 are arranged on the upper surface. In addition copper lower leads 6 are arranged on the lower surface opposite to the upper surface. The upper leads 5 and the lower leads 6 are provided with copper pads 7. At least some of these copper pads 7 are used for providing vias 8, wherein each one of said vias 8 is arranged for conductively connecting one of said upper leads 5 with one of said lower leads 6 for forming a coil turn, as shown in FIG. 2.

As schematically shown in the example of FIG. 1, each of the areas between two through openings 3 comprises a coil 10 having six coil turns, and each of the areas between a through opening 3 and the longitudinal edge of the PCB comprises a coil 11, 12 having three coil turns. All these coils 10, 11, 12 are connected in series and the first coil 11 and the last coil 12 (also denoted the third coil in the enclosed claim 3) of said series are connected to a connecting pad 9 on the edge of the PCB for providing substantially the same current I through all coils 10, 11, 12 of the electromagnetic deflector. As schematically shown in FIG. 2, when directing an electrical current I through said coil turn, a magnetic field B is generated inside said coil turn.

It is noted that the coils 10, 11, 12 used in the electromagnetic deflector of the present invention are flat and wide. The height of the coils is substantially equal to the thickness of the PCB 2 of, for example, 1.5 millimeters. The width of the coils extend beyond the length of the through openings 3 which may be as large as several centimeters, for example, larger than 3.0 centimeters.

Figure 3:
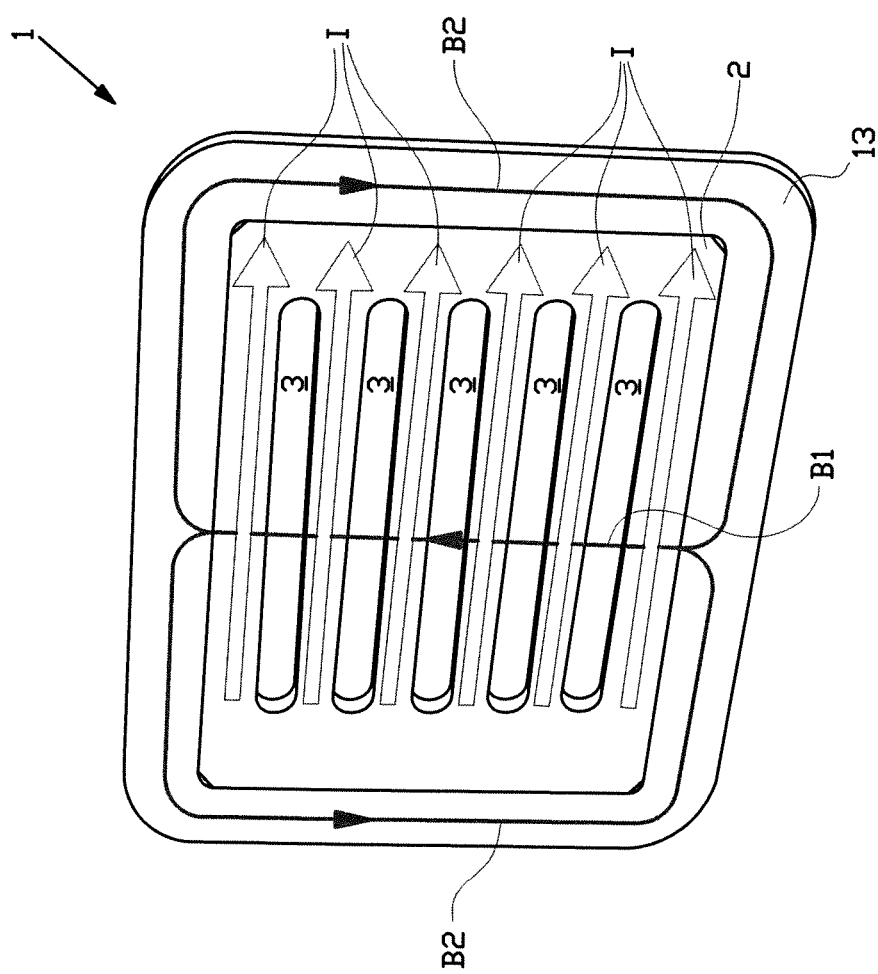

As schematically shown in FIG. 1, the PCB 2 is surrounded by a square closed ferrite core 13. The PCB 2 is mounted inside the rectangular opening inside the square closed ferrite core 13. The first coil 11 and the last coil 12 are arranged adjacent the ferrite core 13, which ferrite core 13, in use, acts as a flux confinement member. As schematically shown in FIG. 3, when directing a current I through the coils of the electromagnetic deflector 1, a magnetic flux B1 is generated which traverses all the coils and the through openings 3 in the PCB 2. The magnetic flux B1 leaving the PCB 2 at the first coil 11 is captured and confined by the ferrite core 13. The ferrite core 13 confines and returns the flux around the PCB 2 towards the last coil 12, where the magnetic flux enters the PCB 2. The returning magnetic flux B2 is effectively confined within said ferrite core 13 and substantially in the plane of the electromagnetic deflector 1. The effect of magnetic stray fields above or below the electromagnetic deflector 1 is at least reduced, and in practice substantially nullified.

Figure 4:
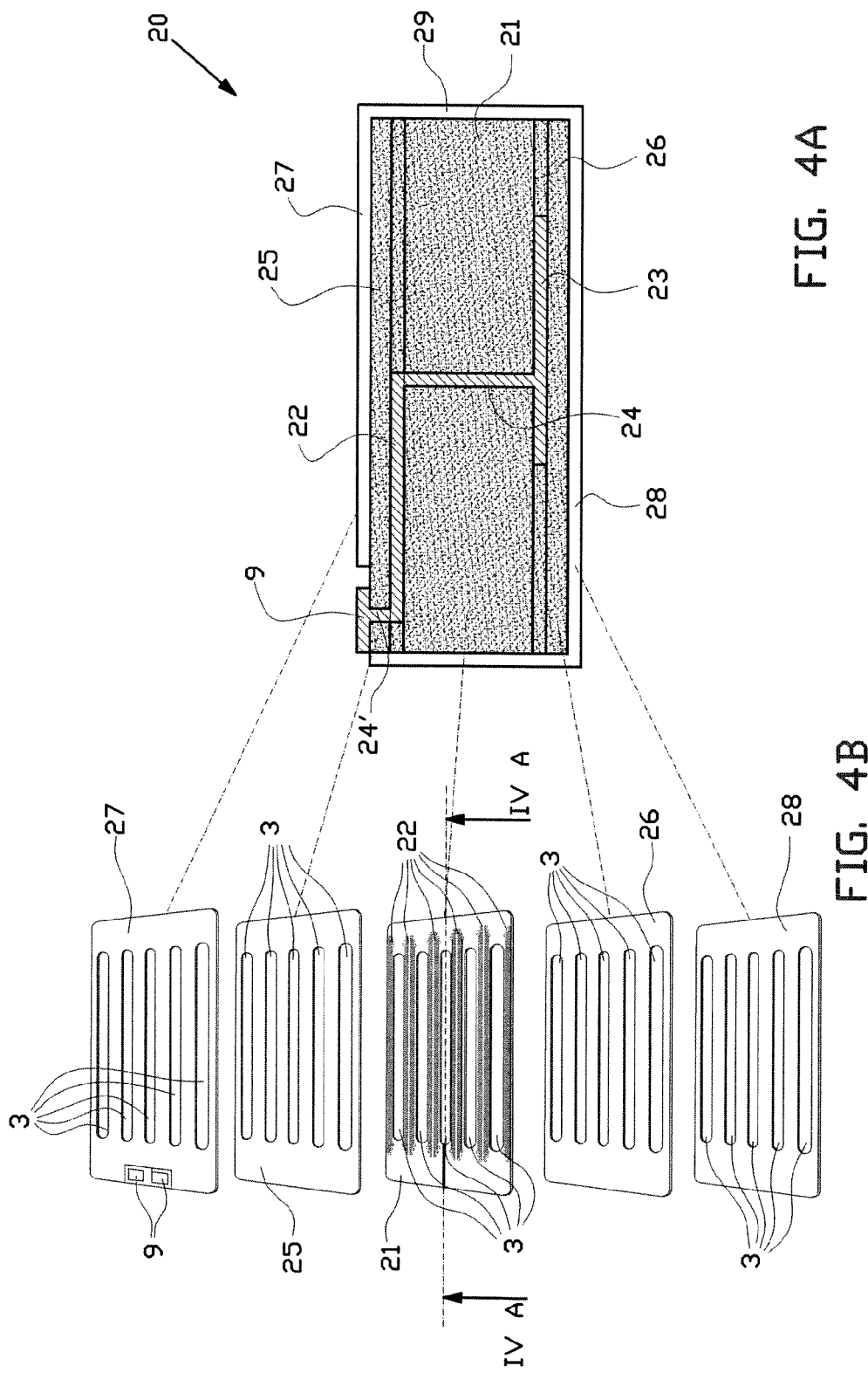
FIG. 4A shows a schematic cross-section of a second example of a charged particle optical device with an electromagnetic deflector of the invention.
FIG. 4B shows a schematic exploded view of the second example of FIG. 4A.

FIG. 4A shows a schematic cross section of the substantially flat substrate of a second example of a charged particle optical device with an electromagnetic deflector of the invention. FIG. 4B shows this substrate in an exploded view.

The flat substrate of this second example comprises a multilayer PCB 20. The multi-layer PCB 20 is provided with five through openings 3 for passing a multitude of charged particle beamlets there through. On the areas between the individual through openings 3 and between the through openings 3 and the longitudinal edges of the PCB 20, coils are arranged by means of copper upper leads 22, copper lower leads 23, and vias 8, as explained below.

The multilayer PCB 20 comprises a central PCB layer 21 carrying the upper leads 22 and the lower leads 23. The central PCB is provided with vias 24, wherein each one of said vias 24 is arranged for conductively connecting one of said upper leads 22 with one of said lower leads 23 for forming a coil turn, in the same way as in the first example as shown in FIG. 2.

The central PCB layer 21 is sandwiched between a thinner top PCB layer 25 and thinner bottom PCB layer 26. The top PCB layer 25 and the bottom PCB layer 26 protect the upper leads 22 and the lower leads 23 respectively, and the vias 24. The thickness of such a multilayer PCB 20 is, for example, 2 millimeters.

As schematically shown in FIGS. 4A and 4B, the connecting pads 9 of this second embodiment are provided on top of said top PCB layer 25, which pads 9 are electrically connected with the leads 22, 23 of the central PCB layer 21 by means of vias 24' in the top PCB layer 25.

The side of the top PCB layer 25 facing away from the central PCB layer 21 is substantially completely covered by a copper layer 27. Also the side of the bottom PCB layer 26 facing away from the central PCB layer 21 is substantially completely covered by a copper layer 28. In addition, the outer circumferential edges of the multilayer PCB are substantially completely covered by a copper layer 29 as shown in the cross section of FIG. 4A. Also the inner circumferential edge of the through opening(s) 3 are substantially completely covered by a copper layer (not shown). Thus substantially the complete outer sides of the multilayer PCB 20 is covered by a copper layer 27, 28, 29 and the outer side of the copper layer is provided with a Molybdenum coating.

Usually the multilayer PCB 20 is mounted inside the rectangular opening inside the square closed ferrite core (not shown in FIGS. 4A and 4B) in the same way as in the first example as shown in FIG. 1.

Figure 5:
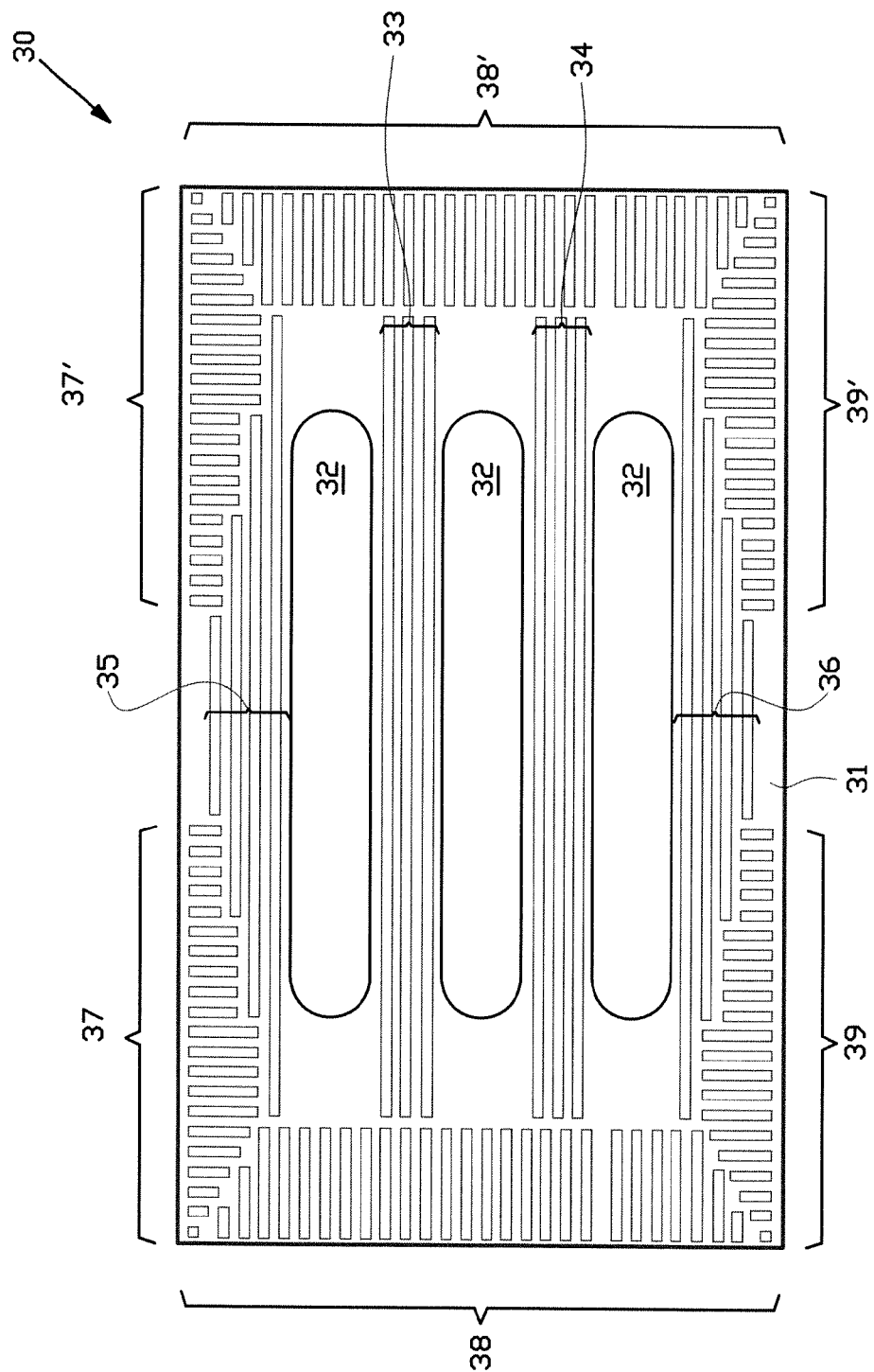
FIG. 5 shows a schematic view of a third example of a charged particle optical device with an electromagnetic deflector of the invention.

FIG. 5 shows a top view of a third example of a charged particle optical device with an electromagnetic deflector 30 of the invention. The flat substrate of this third example comprises a PCB 31. The PCB 31 is provided with three through openings 32 for passing a multitude of charged particle beamlets there through. On the areas between the individual through openings 32 and between the through openings 32 and the longitudinal edges of the PCB 31, primary coils 33, 34, 35, 36 are arranged by means of copper upper leads, copper lower leads, and vias, in the same way as in the first or the second example.

As schematically shown in FIG. 5, the area of the PCB 31 with the through openings 32 and the primary coils 33, 34, 35, 36 is surrounded by return coils 37, 38, 39, 37', 38', 39'. In use, the return coils acts as a flux confinement member. In stead of using a ferrite core as in the first and second example, the third example is provided with the return coils which are made in the same way as the primary coils 33, 34, 35, 36 using copper upper leads, copper lower leads, and vias arranged for conductively connecting one of said upper leads with one of said lower leads for forming coil turns.

In an embodiment, the return coils 37, 38, 39, 37', 38', 39' are connected in series with the primary coils 33, 34, 35, 36. In use, substantially the same current is directed through all the primary and return coils.

In an alternative embodiment the return coils 37, 38, 39, 37', 38', 39' are connected separate from the primary coils 33, 34, 35, 36. In use, the current through the return coils 37, 38, 39, 37', 38', 39' can be set at a different level as the current through the primary coils 33, 34, 35, 36 to obtain the desired flux confinement.

When directing a current I through the primary and return coils of the electromagnetic deflector 30, a magnetic flux is generated which traverses all the coils and the through openings 32 in the PCB 31. The primary and return coils on the PCB 31 provide a substantially closed flux path in which the magnetic flux, which is generated by the primary and return coils, is confined. Thus the magnetic flux is substantially confined within the PCB 31.

Figure 6:
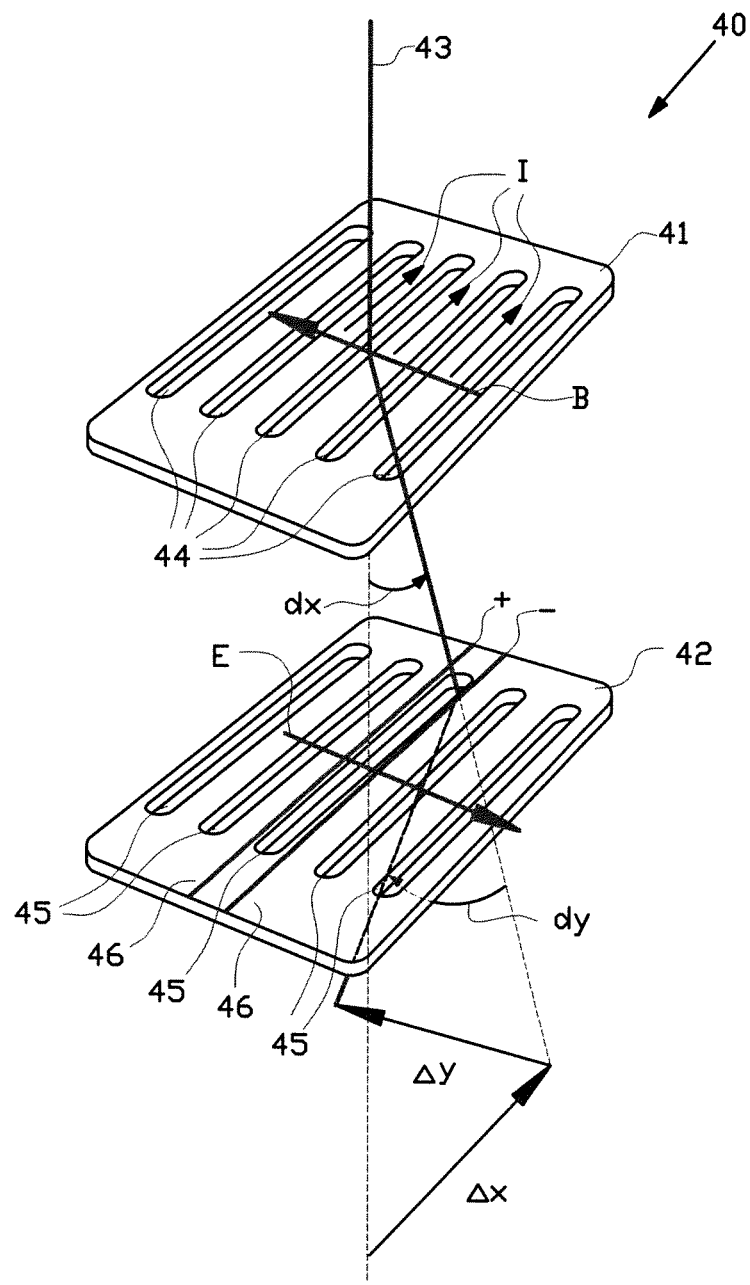
FIG. 6 shows a schematic view of a first example of a charged particle optical device with a deflector assembly comprising an electromagnetic deflector of the invention and an electrostatic deflector.

FIG. 6 shows a schematic view of a first example of a charged particle optical device with a deflector assembly 40 comprising an electromagnetic deflector 41 of the invention and an electrostatic deflector 42. For alignment or scanning of a charged particle beam, for example an electron beam 43, over an area, de electron beam 43 needs to be deflected in two substantially orthogonal directions, in this example denoted as X direction and Y direction.

As shown in FIG. 6, the electron beam 43 traverses one of the through openings 44 of the electromagnetic deflector 41. When a current I is directed through the coils, a magnetic field B is generated which deflects the trajectory of the electron beam 43 in the direction dx. This provides a shift of Δx at the position of a sample to be exposed by said electron beam 43.

The electron beam 43 also traverses one of the through openings 45 of the electrostatic deflector 42. When a potential difference is applied on the electrodes 46 on either side of the through opening 45, an electric field E is generated which deflects the trajectory of the electron beam 43 in the direction dy. This provides a shift of Δy at the position of the sample to be exposed by said electron beam 43.

It is noted that the amount of deflection with respect to the size of the electromagnetic deflector 41 and of the electrostatic deflector 42 is greatly exaggerated in FIG. 6, in order to explain the effect of the combination of the deflector assembly 40. For example, in a multibeamlet maskless charged particle lithography system, the range in which Δy on the wafer is needed is very limited, for example approximately +/−100 nanometers.

Although not shown in the schematic FIG. 6, the electromagnetic deflector 41 is provided with a flux confinement member as in the first or third example, which is arranged around the electromagnetic deflector 41 to confine the returning magnetic field substantially in the plane of the electromagnetic deflector 41 as described above in more detail.

Figure 7:
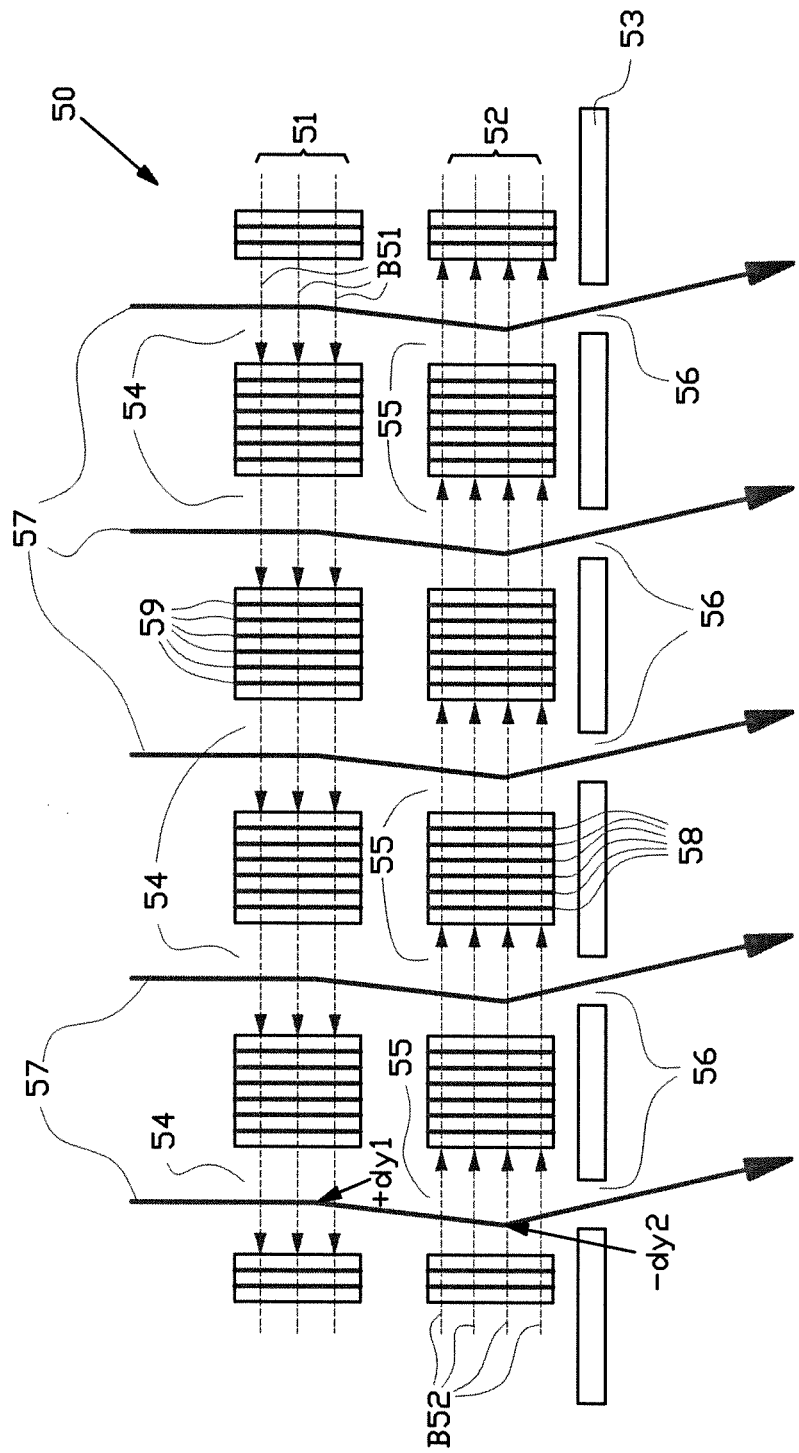
FIG. 7 shows a schematic view in cross section of a second example of a charged particle optical device with a deflector assembly comprising two electromagnetic deflectors of the invention.

FIG. 7 shows a schematic view in cross section of a second example of a charged particle optical device with a deflector assembly 50 comprising two electromagnetic deflectors 51, 52 of the invention, wherein a second electromagnetic deflector 52 is arranged at a distance form a first electromagnetic deflector 51 in a direction along the trajectory of the beamlets 57, in particular the trajectory without deflection of the deflectors 51, 52.

As schematically depicted in the cross section of FIG. 7, the through openings 55 of the second electromagnetic deflector 52 are in line with the through openings 54 of the first electromagnetic deflector 51. The second electromagnetic deflector 52 is arranged with respect to the first electromagnetic deflector 51 such that at least the coils 58 of the second electromagnetic deflector 52 extend substantially parallel to the coils 59 of the first electromagnetic deflector 51. The coils 58, 59 are represented in the cross section of FIG. 7 by the vias.

The first electromagnetic deflector 51 is arranged for deflecting the beamlets 57 in a +dy1 direction schematically indicated in FIG. 7 (please note that +dy1 is in fact directed into the plane of the drawing) by driving a current through the coils 59 of the first electromagnetic deflector 51 and establishing the magnetic field B51. The second electromagnetic deflector 52 is arranged for deflecting the beamlets 57 in a −dy2 direction schematically indicated in FIG. 7 (please note that −dy2 is in fact directed out of the plane of the drawing) by driving a current through the coils 58 of the second electromagnetic deflector 52 and establishing the magnetic field B52. Thus the second electromagnetic deflector 52 is arranged and/or controlled for deflecting the beamlets 57 in a direction substantially opposite to a deflection of the first electromagnetic deflector 51.

The assembly 50 with two electromagnetic deflectors 51, 52 can be used to provide various ways for manipulating the trajectory of the beamlets 57. For example when the deflection of the second electromagnetic deflector 52 has the same magnitude as the deflection of the first electromagnetic deflector, but at an opposite direction, the beamlets 57 coming out of the assembly 50 are substantially parallel to the incoming beamlets but are shifted in a direction into or out of the plane of the drawing of FIG. 7.

In the example as shown in FIG. 7, it is accomplished that the beamlets 57 pass through the centre part of a through opening 56 of a beam stop array or lens array 53, even when deflected. Thus movement of the beamlets 57 over the beam stop array or lens array 53 can be prevented.

It is noted that a movement of the beamlets 57 over a beam stop array would at least partially block the beamlets 57, which would result in dose errors. A movement of the beamlets 57 over a lens array would passes said lenses of the lens array at their center, which would result in aberrations of the beamlets 57, for example spherical aberrations of the beamlets 57.

The mutual distance between the first and second electromagnetic deflectors 51, 52 and the strength of the magnetic field are adjusted in order to direct the beamlets 57 through the centre part of the beam stop or lens. The strength of the magnetic fields B51, B52 are preferably mutually coupled. They can be changed in such a way that the pivot points of the beamlets 57 are situated in the plane of the beam stop array or lens array 53 and at the centre part of the beam stops or lenses.

The same way of manipulating charged particle beamlets can also be done with two electrostatic deflectors is described in WO 2010/125526, which is hereby incorporated by reference in its entirety, assigned to the owner of the present invention.

Although not shown in the schematic FIG. 7, both electromagnetic deflectors 51, 52 are provided with a flux confinement member as in the first or third example, which is arranged around the corresponding electromagnetic deflector 51, 52 to confine the returning magnetic field substantially in the plane of said electromagnetic deflector 51, 52 as described above in more detail.

Figure 8:
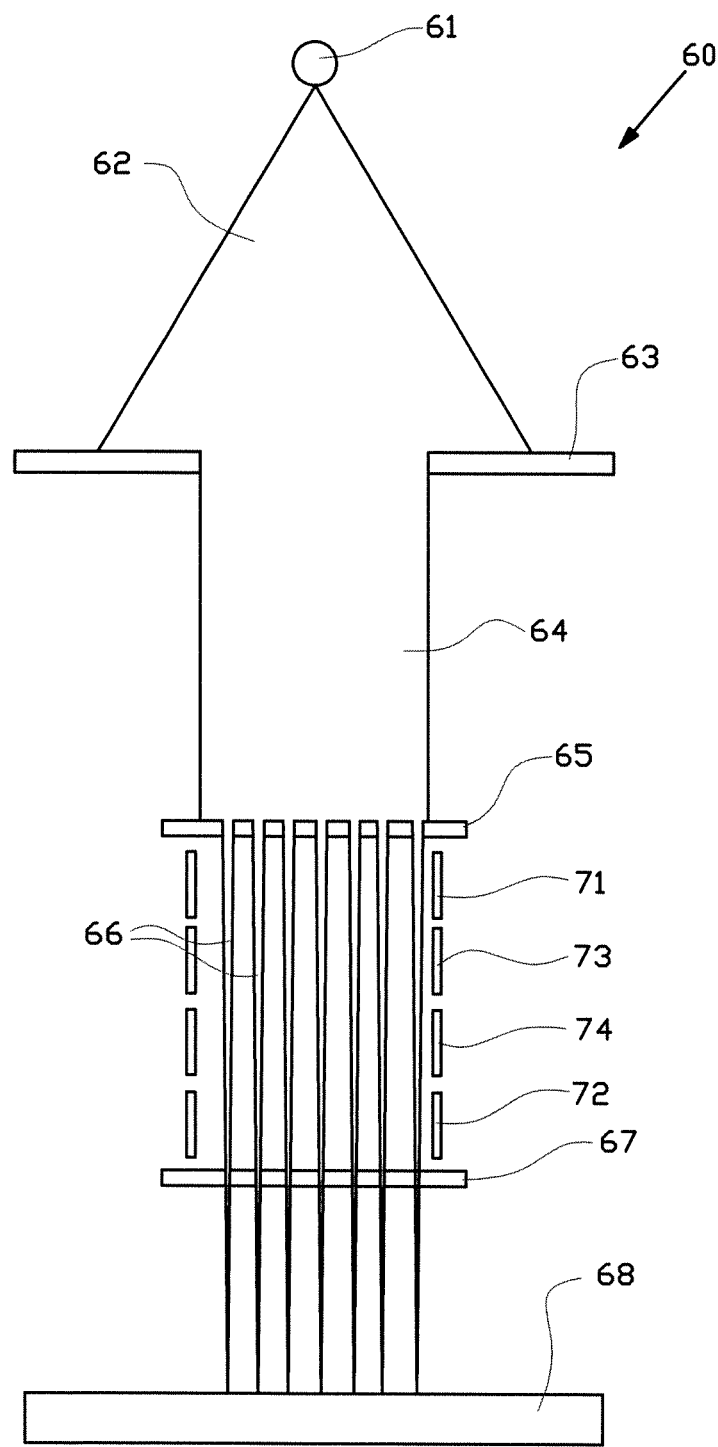
FIG. 8 shows a simplified schematic drawing in cross-section of an example of a charged particle multi-beamlet exposure system of the invention.

FIG. 8 shows a simplified schematic drawing in cross-section of an example of a charged particle multi-beamlet exposure system 60 of the invention. Such an exposure system 60 suitably comprises a beam generator comprising a source 61 for emitting a diverging charged particle beam 62, a collimator 63 for collimating the charged particle beam 62 into a collimated beam 64, and an aperture array 65 for generating a plurality of substantially parallel charged particle beamlets 66.

In addition the aperture array 65 comprises a blanking deflector for each charged particle beamlet 66. At a distance from the aperture array 65 a beam stop array 67 is arranged. When the charged particle beamlets 66 are not deflected by the blanking deflector, the charged particle beamlets 66 pass through openings in the beam stop array 67 and are directed onto a sample 68 via a projection lens system arranged directly below said beam stop array 67. When the blanking deflector for one of said charged particle beamlets 67 is activated, the corresponding charged particle beamlet is deflected and is blocked by the beam stop array 67. By activating or not activating said blanking deflector, the beamlets 67 can be modulated.

In order to correctly align the charged particle beamlets 66 on the beam stop array 67, two electromagnetic deflectors 71, 72 and two electrostatic deflectors 73, 74 are arranged between the blanking deflector at the aperture array 65 and the beam stop array 67 as schematically shown in FIG. 8. The two electromagnetic deflectors 71, 72 may be any one of the previously described examples, or any other electromagnetic deflector having the inventive features as described in enclosed claim 1.

Figure 9:
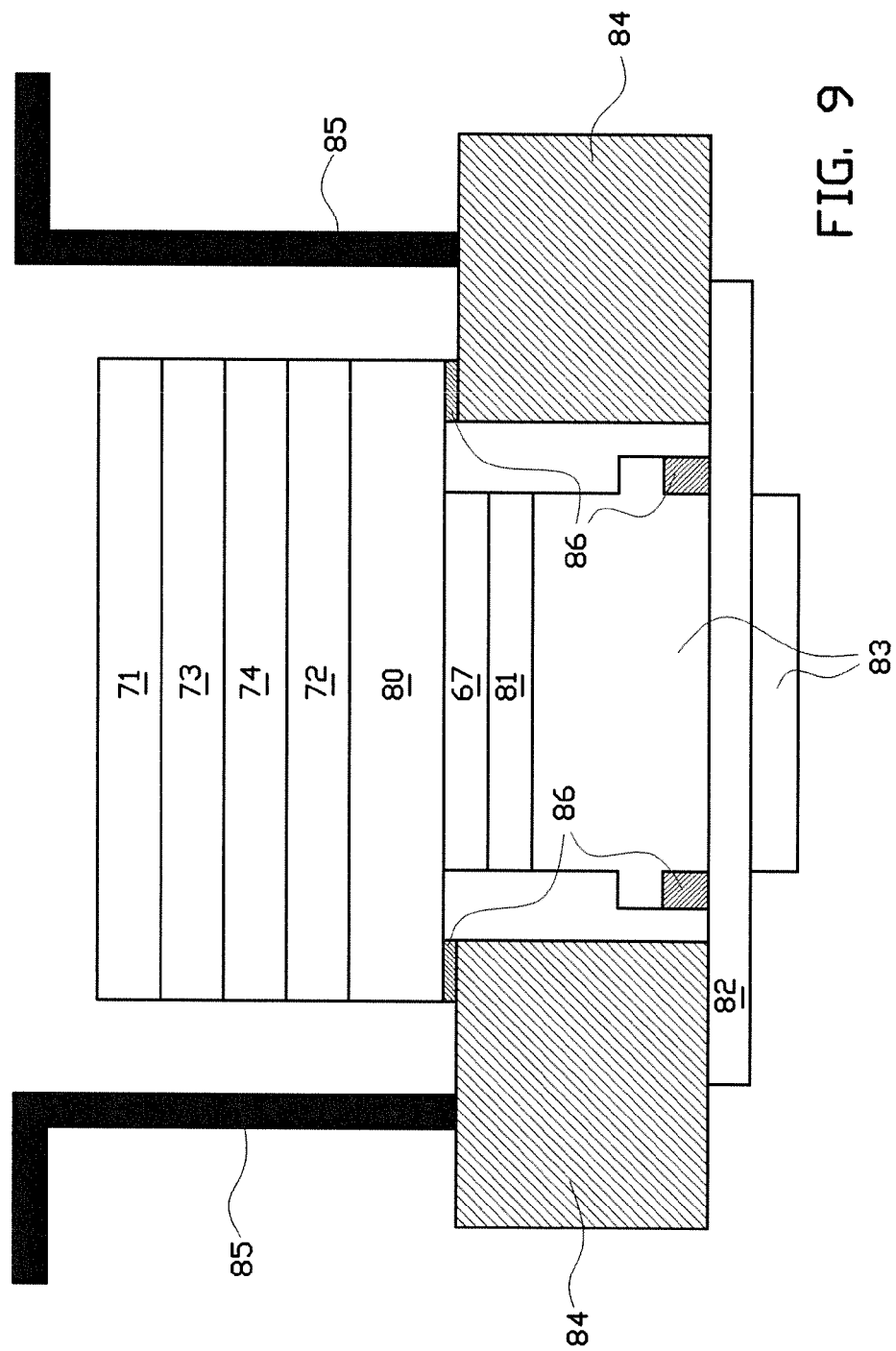
FIG. 9 shows a simplified schematic drawing in cross-section of a projection assembly for use in a charged particle multi-beamlet exposure system.

A more detailed presentation is shown in FIG. 9. FIG. 9 shows a simplified schematic drawing in cross-section of a projection assembly for use in a charged particle multi-beamlet exposure system. As shown in the example in FIG. 9, the two electromagnetic deflectors 71, 72 and the two electrostatic deflectors 73, 74 are mounted on top of each other to form a deflector stack which is mounted on top of a cooling arrangement 80. An example of such a cooling arrangement 80 is described in PCT/EP2013/059948, which is hereby incorporated by reference in its entirety, assigned to the owner of the present invention.

The cooling arrangement 80 is predominantly provided for cooling the beam stop array 67 which is arranged directly below the cooling arrangement 80. However, by arranging the deflector stack 71, 72, 73,74 on top of the cooling arrangement 80, the deflector stack 71, 72, 73, 74 the cooling arrangement 80 acts as a heat sink, and will reduce, in use, the thermal load of the deflectors 71, 72, 73,74 in the stack.

Below the beam stop 67, a projection lens assembly 83 is arranged. On the one hand the projection lens assembly 83 is connected to the beam stop array 67 via a spacer 81, and on the other hand the projection lens assembly 83 is connected to a carrier ring 84 via a spacer 82, for example using a glue connection 86. In addition the cooling arrangement 80 is also connected to said carrier ring 84, for example using a glue connection 86.

The carrier ring 84 is mounted inside the housing of the exposure system 60 by means of flexures 85.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In summary, the invention relates to a charged particle optical device for manipulating a trajectory of multiple beamlets of charged particles. Said charged particle optical device comprising an electromagnetic deflector comprising a planar substrate having an upper side and a lower side of said substrate, and an even thickness. The substrate comprises:

a through opening for passing said beamlets there through, wherein said through opening debouches in the upper and lower side of said substrate;

a first and a second coil, wherein each of said coils preferably is a substantially helical coil and comprises conducting upper leads arranged at the upper side, conducting lower leads arranged at the lower side, and vias extending through said substrate and which conductively connect one of said upper leads with one of said lower leads for forming said coil;

wherein said first and second coils are arranged on either side of the through opening.

LIST OF REFERENCE NUMERALS 1 electromagnetic deflector
2 Printed Circuit Board (PCB)
3 through opening
4 longitudinal edge
5 upper lead
6 lower lead
7 pad
8 via
9 connecting pad
10 coil
11 first coil
12 last coil
13 ferrite core
20 multilayer PCB
21 central PCB layer
22 upper leads
23 lower leads
24, 24' vias
25 top PCB layer
26 bottom PCB layer
27, 28, 29 copper layer
30 electromagnetic deflector
31 PCB
32 through opening
33, 34, 35, 36 primary coils
37, 38, 39 return coils
37', 38', 39' return coils
40 deflector assembly
41 electromagnetic deflector
42 electrostatic deflector
43 electron beam
44, 45 through opening
46 electrodes
50 deflector assembly
51 first electromagnetic deflector
52 second electromagnetic deflector
53 beam stop array or lens array
54, 55, 56 through opening
57 beamlets
58, 59 coil
60 multi-beamlet exposure system
61 source
62 diverging charged particle beam
63 collimator
64 collimated beam
65 aperture array
66 charged particle beamlet
67 beam stop array
71, 72 electromagnetic deflector
73, 74 electrostatic deflector
80 cooling arrangement
81, 82 spacer
83 projection lens assembly
84 carrier ring
85 flexure
86 glue connection
B magnetic field
B1 magnetic flux
B2 returning magnetic flux
d thickness of PCB dx, dy deflection direction
Δx, Δy shift at the position of the sample
E electric field
+dy1 deflection direction of first electromagnetic deflector
−dy2 deflection direction of second electromagnetic deflector
B51, B52 magnetic field
I electrical current

The invention claimed is:

1. A charged particle optical device for manipulating a trajectory of one or more beamlets of charged particles, said charged particle optical device comprising a first electromagnetic deflector comprising a substantially planar substrate having a first surface at or near an upper side of said substantially planar substrate, a second surface at or near a lower side of said substantially planar substrate, and a substantially even thickness, wherein the substrate comprises:
   a through opening for passing said one or more beamlets there through, wherein said through opening debouches in the upper side and lower side of said substantially planar substrate;
   a first and a second coil, wherein each of said first and second coil comprises one or more conducting upper leads arranged on the first surface, one or more conducting lower leads arranged on the second surface, and one or more vias which extend through said substrate wherein each of said vias is arranged for conductively connecting one of said upper leads with one of said lower leads for forming said coil;
   wherein said first and second coils are arranged on either side of the through opening.

2. Charged particle optical device according to claim 1, wherein said first and/or said second coil comprises a substantially helical coil.

3. Charged particle optical device according to claim 1, wherein the through opening defines a substantially rectangular window having two longitudinal sides and two transverse sides, wherein the first and second coils are arranged adjacent said longitudinal sides.

4. Charged particle optical device according to claim 1, wherein the through opening is a first through opening for passing a first set of one or more beamlets there through, and wherein the substrate comprises:
   a second through opening for passing a second set of one or more beamlets there through, wherein said second through opening debouches in the upper side and lower side of said substantially planar substrate, and wherein said second through opening is arranged at a side of said second coil facing away from said first through opening, and
   a third coil, wherein said third coil comprises one or more conducting upper leads arranged on the first surface, one or more conducting lower leads arranged on the second surface, and one or more vias which extend through said substrate wherein each of said vias is arranged for conductively connecting one of said upper leads with one of said lower leads for forming said coil;
   wherein said third coil is arranged on a side of the second through opening facing away from said second coil.

5. Charged particle optical device according to claim 4, wherein said third coil comprises a substantially helical coil.

6. Charged particle optical device according to claim 4, wherein the substantially flat substrate is provided with one or more further through openings which are arranged between the first and second through opening, wherein the first, second and further through openings are arranged at a distance from each other, and wherein at an area between two of said through openings a coil is arranged.

7. Charged particle optical device according to claim 4, further comprising a flux confinement member which is arranged around the coils at a side facing away from the through opening(s), wherein the flux confinement member is arranged adjacent the first and third coil.

8. Charged particle optical device according to claim 7, wherein the number of coil turns of the second coil is equal to the number of coil turns of the first coil plus the number of coil turns of the third coil.

9. Charged particle optical device according to claim 1, further comprising a flux confinement member which is arranged around the coils at a side facing away from the through opening(s).

10. Charged particle optical device according to claim 9, wherein the flux confinement member is arranged to surround the substantially planar substrate.

11. Charged particle optical device according to claim 9, wherein the flux confinement member comprises a magnetizable material, preferably ferrite.

12. Charged particle optical device according to claim 1, wherein the at least the first and second surfaces of the substantially planar substrate, with the exception of the through opening(s), are substantially covered with a first layer of electrical insulating material and a second layer of electrical conducting material, wherein the first layer is sandwiched between the second layer and the substantially planar substrate.

13. Charged particle optical device according to claim 12, wherein the through opening(s) comprises an inner circumferential edge, wherein said inner circumferential edge is substantially covered with a layer of electrical conducting material.

14. Charged particle optical device according to claim 12, wherein the planar substrate comprises an outer circumferential edge, wherein said outer circumferential edge is substantially covered with a layer of electrical conducting material.

15. Charged particle optical device according to claim 12, wherein the second layer comprises a layer of Molybdenum, which layer of Molybdenum is arranged at a side of the second layer facing away from the substantially planar substrate.

16. Charged particle optical device according to claim 1, wherein the charged particle optical device comprises a second electromagnetic deflector which substantially is a duplicate of the first electromagnetic deflector, and is arranged at a distance from said first electromagnetic deflector, in particular in a direction along the trajectory, wherein one of the one or more through openings of the second electromagnetic deflector is in line with one of the one or more the through openings of the first electromagnetic deflector.

17. Charged particle optical device according to claim 16, wherein the second electromagnetic deflector is arranged with respect to the first electromagnetic deflector such that at least the first and second coils of the second electromagnetic deflector extend substantially parallel to the first and second coils of the first electromagnetic deflector.

18. Charged particle optical device according to claim 16, wherein the second electromagnetic deflector is arranged and/or controlled for deflecting the one or more beamlets in a direction substantially opposite to a deflection of the first electromagnetic deflector.

19. Charged particle optical device according to claim 1, wherein the charged particle optical device further comprises a first electrostatic deflector comprising a second substantially planar substrate having a substantially even thickness,
   wherein the second substrate comprises one or more through openings for passing said one or more beamlets there through, wherein said one or more through openings debouche in an upper side and a lower side of said second substrate, wherein at each through opening said second substrate comprises a first and a second electrode which are arranged on either side of the through opening for providing an electric field in said through opening,
wherein the first electrostatic deflector is arranged at a distance from said first electromagnetic deflector, in particular in a direction along the trajectory, wherein at least one of the one or more through openings of the first electrostatic deflector is in line with one of the one or more through openings of the first electromagnetic deflector.

20. Charged particle optical device according to claim 19, wherein the first electrostatic deflector is arranged with respect to the first electromagnetic deflector such that at least the first and second electrode of the first electrostatic deflector extend substantially parallel to the first and second coils of the first electromagnetic deflector.

21. Charged particle optical device according to claim 19, wherein the charged particle optical device comprises a second electrostatic deflector which substantially is a duplicate of the first electrostatic deflector, and is arranged at a distance from said first electrostatic deflector, in particular in a direction along the trajectory, wherein at least one of the one or more through openings of the second electrostatic deflector is in line with one of the one or more through openings of the first electrostatic deflector.

22. Charged particle optical device according to claim 21, wherein the second electrostatic deflector is arranged with respect to the first electrostatic deflector such that at least the first and second electrodes of the second electrostatic deflector extend substantially parallel to the first and second electrodes of the first electrostatic deflector.

23. Charged particle optical device according to claim 21, wherein the second electrostatic deflector is arranged and/or controlled for deflecting the one or more beamlets in a direction substantially opposite to a deflection of the first electrostatic deflector.

24. Charged particle optical device according to claim 1, wherein the charged particle optical device comprises a cooling arrangement or is mounted onto a cooling arrangement.

25. Charged particle optical device according to claim 24, wherein the cooling arrangement comprises a third substantially planar substrate having a substantially even thickness,
wherein the third substrate comprises one or more through openings for passing said one or more beamlets there through, wherein said one or more through openings debouche in an upper side and a lower side of said third substrate,
wherein said third substrate is provided with flow channels for a cooling fluid which flow channels are arranged adjacent said through openings,
wherein at least one of the one or more through openings of the cooling arrangement is in line with one of the one or more through openings of the first electromagnetic deflector.

26. A charged particle multi-beamlet exposure system for exposing a target using a plurality of charged particle beamlets, wherein the system comprises:
a beamlet generator for generating the plurality of charged particle beamlets;
a beamlet projector for projecting one or more of said plurality of charged particle beamlets onto a surface of said target, wherein the beamlet projector comprises a charged particle optical device according to claim 1.

27. Charge particle multi-beamlet exposure system according to claim 26, wherein said system further comprises a beamlet modulator for patterning the beamlets to form modulated beamlets, and wherein said beamlet projector is arranged for projecting the modulated beamlets onto said surface of the target.

28. Charged particle multi-beamlet exposure system according to claim 26, wherein said system is a lithography system or a microscopy system.

29. Method for manipulating a trajectory of one or more beamlets of charged particles in a charged particle multi-beamlet exposure system according to claim 26, wherein said method comprises the step of:
directing an electrical current through said first and second coil in order to provide a magnetic field inside said through opening which deflect the one or more beamlets which pass through said through opening in a direction substantially transverse to said magnetic field.

* * * * *